(12) United States Patent
Kubota et al.

(10) Patent No.: US 6,445,026 B1
(45) Date of Patent: Sep. 3, 2002

(54) SEMICONDUCTOR DEVICE HAVING A MEMORY CELL WITH A PLURALITY OF ACTIVE ELEMENTS AND AT LEAST ONE PASSIVE ELEMENT

(75) Inventors: Michitaka Kubota; Toshio Kobayashi, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/626,073

(22) Filed: Jul. 26, 2000

(30) Foreign Application Priority Data

Jul. 29, 1999 (JP) .......................................... 11-215800

(51) Int. Cl.[7] .......................................... H01L 27/108
(52) U.S. Cl. ........................................ 257/296; 257/306
(58) Field of Search ................................ 257/296, 306, 257/390, 391, 288, 298; 365/149

(56) References Cited

U.S. PATENT DOCUMENTS 4,209,797 A * 6/1980 Egawa et al. ................. 257/376
4,920,391 A * 4/1990 Uchida ........................ 365/149
5,675,160 A * 10/1997 Oikawa ....................... 257/296
5,771,189 A * 6/1998 Jun et al. ..................... 365/149

* cited by examiner

*Primary Examiner*—Nathan Flynn
*Assistant Examiner*—Leonardo Andujar
(74) *Attorney, Agent, or Firm*—Sonnenschein, Nath & Rosenthal (57) ABSTRACT

A semiconductor device capable of reducing a cell area without affecting the accuracy, capable of reducing the number of interconnection layers, and capable of realizing a hybrid circuit of a memory cell and peripheral circuit easily and at a low cost, including a bit line, a word line, control gate line, a capacitor with a first electrode connected to the word line, a read transistor comprising an NMOS connected between the bit line and a predetermined potential point and with a gate electrode connected to a second electrode of a capacitor, and a write transistor comprising an NMOS connected between the bit line and the second electrode of the capacitor and with a gate electrode connected to the control gate line.

10 Claims, 10 Drawing Sheets

FIG.1
GMC

SEMICONDUCTOR DEVICE HAVING A MEMORY CELL WITH A PLURALITY OF ACTIVE ELEMENTS AND AT LEAST ONE PASSIVE ELEMENT

RELATED APPLICATION DATA

The present application claims priority to Japanese Application No. P11-215800 filed Jul. 29, 1999 which application is incorporated herein by reference to the extent permitted by law.

BACKGROUND OF THE INVENTION

1. Field of the Invention

The present invention relates to a semiconductor device, more particularly, to a DRAM gain cell suitable for embedding with a logic circuit.

2. Description of the Related Art

In recent years, semiconductors have been becoming increasingly miniaturized. Not only are many elements embedded on a single chip, but also several functions have to be incorporated.

As a typical example of this, there is a LSI embedding both a DRAM and logic circuit.

By embedding not only a logic circuit but also a memory in an ASIC (application specific integrated circuit), the range of application of the ASIC is expanded.

Figure 10:
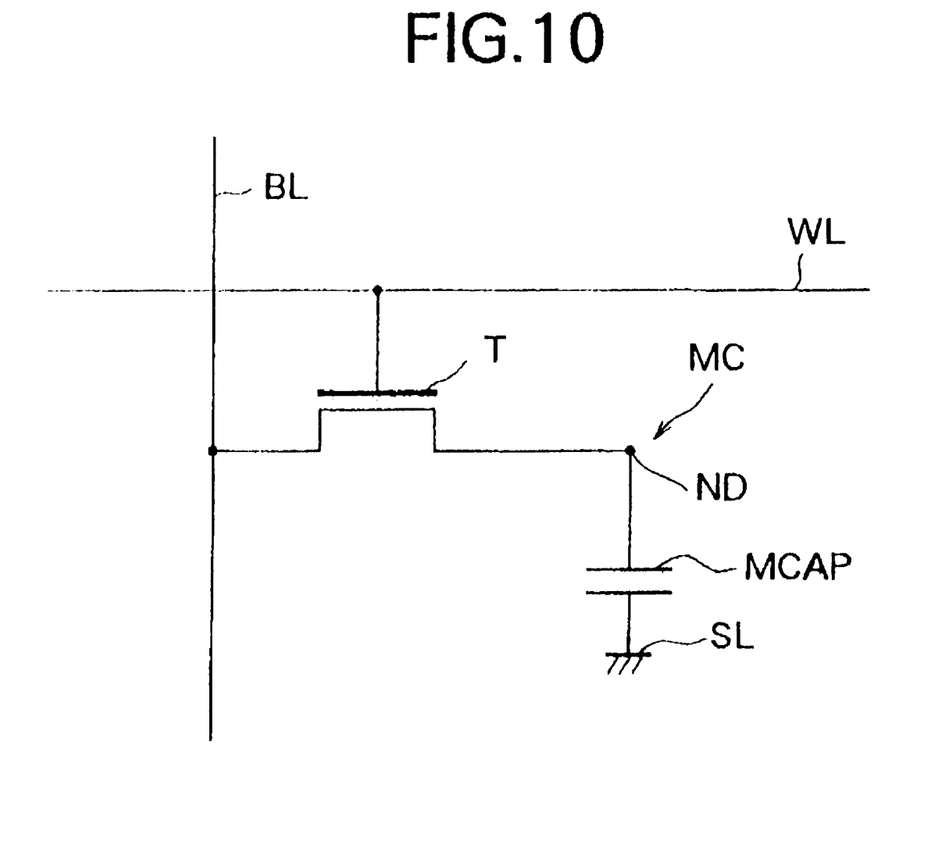
FIG. 10 is a circuit diagram of a one-transistor one-capacitor type DRAM cell.

At the present time, in a DRAM (dynamic random access memory), the most typical type of high density, high capacity semiconductor memory, as shown in FIG. 10, a memory cell is configured by connecting a transistor T controlled in on/off state by the potential of a word line WL and a memory capacitor MCAP in series between a bit line BL and common potential line SL.

In a one-transistor one-capacitor type memory cell MC, a connection point between the memory capacitor MCAP and the transistor T forms a storage node ND. The "1" or "0" of data is differentiated by a difference of the amount of a charge stored in this storage node.

It is necessary to cause a sufficiently large potential change in the bit line BL in order to secure stable operation when reading stored data. The capacity for storage of a charge (capacitance of the capacitor) is determined for the memory capacitor MCAP from this viewpoint.

Along with the reduction in the occupied area by a semiconductor memory cell, however, the capacitance value of the capacitor itself tends to fall. In addition, the increases in memory capacity have led to an increase in the bit line capacitance. Therefore, it is becoming even harder to obtain a readable bit line potential compared with the past.

As measures to solve this problem, various capacitor structures have been proposed such as a stack type, fin type, cylindrical type, or other stacked capacitor having a capacitor electrode increased in surface area per unit area and a trench capacitor etc.

However, due to the limits in processing technology on the aspect ratio of the trench formed on a substrate, the height of a stacked electrode layer, etc. or the increase of the number of process steps for forming a complex structure and the resultant increase in manufacturing cost etc., it is becoming difficult to increase the capacitance value of a capacitor per unit area.

On the other hand, the capacitance of a capacitor is proportional to the dielectric constant of a capacitor insulating film sandwiched between electrodes, so a capacitor insulation material with a high dielectric constant is also being developed.

In addition to the difficulty of development of a dielectric material itself, however, there are extensive development themes such as development of electrode materials with a good affinity with the dielectric or development of processing techniques for these new materials. Also, the development costs or newly introduced production equipment etc. pose an sizeable burden. As a result, the DRAM production cost has been continuously increasing. Therefore, even if the cell area is reduced and DRAMs are made larger in capacity, it is proving hard to reduce the cost per bit.

In view of this, when trying to reduce the cell area without changing the structure and materials, the reading signal of a DRAM cell becomes smaller, and, ultimately, it is expected that detecting data stored in the memory cell will become difficult.

Further, as a DRAM cell, in addition to the one-transistor one-capacitor type mentioned above, there is known for example a three-transistor type memory cell not using a capacitor and using three transistors. In this case, in addition to the two word lines for writing and reading, two bit lines for writing and reading besides are necessary so the number of Interconnection layers is increased.

However, a large number of interconnection layers may well become a limiting factor in reducing the cell area.

SUMMARY OF THE INVENTION

The present invention has been made to solve the above problems and has as its object to provide an inexpensive memory having a DRAM function. More particularly, when considering mounting together with a logic circuit, it is to provide a semiconductor device minimizing the effect on the logic process and enable realization of a hybrid circuit of a memory cell and peripheral circuit easily and at a low cost.

The semiconductor device according to the present invention comprises a memory cell having a plurality of active elements and at least one passive element.

Further, in the present invention, the plurality of active elements comprising the memory cell are field effect transistors having three terminals which comprise two diffusion layers forming a source or drain, and a gate or four terminals which comprise two diffusion layers forming a source or drain, a gate and a substrate or a layer which includes an area at which channel is formed, and the passive element comprising the memory cell is a capacitor having an insulating layer between a first electrode and a second electrode.

Further, in the present invention, the active elements comprising the memory cell include at least a transistor having a function of writing data and a transistor having a function of reading data.

Further, in the present invention, the memory cell comprises two field effect transistors and one capacitor, a first field effect transistor is an N-channel type or P-channel type, and a second field effect transistor is also an N-channel type or P-channel type.

Further, in the present invention, the memory cell is configured by a second diffusion layer terminal of the first field effect transistor, the second electrode of the capacitor, and a gate electrode terminal of the second field effect transistor connected together and, further, the first electrode of the capacitor is connected to a word line, a first diffusion layer terminal of the first field effect transistor is connected to a bit line, a gate terminal of the first field effect transistor is connected to a control gate line, a first diffusion layer terminal of the second field effect transistor is connected to the bit line, and a second diffusion layer terminal of the second field effect transistor is connected to a predetermined power supply terminal.

Further, in the present invention, at least one of the first electrode and second electrode of the capacitor serves also as an interconnection layer.

Further, in the present invention, all of the active elements comprising the memory cell are N-type field effect transistors or P-type field effect transistors.

Further, in the present invention, when arranging the memory cell in an array, the gate electrode terminal of the first field effect transistor of each of a plurality of memory cells connected to one word line is connected to one control gate line.

Further, in the present invention, when arranging the memory cell in an array, the gate electrode terminal of the first field effect transistor of each of the plurality of memory cells connected to one bit line is connected to one control gate line.

Further, in the present invention, the memory cell is embedded with a logic circuit.

According to the present invention, the stored charge of the passive element, for example, capacitor, may be one of an extent enabling control of the on/off state of an active element, that is, first field effect transistor (read transistor), in accordance with the stored data.

Therefore, in this memory cell, since there is no need for directly charging and discharging a large capacity bit line by the stored charge of the capacitor such as with a one-transistor one-capacitor type DRAM, the capacity of charge storage of the capacitor can be made small.

At a result, in a memory cell of this structure, it is not necessary to tinker with the capacitor structure to increase the amount of charge storage per unit area or to develop a capacitor dielectric material of a high dielectric constant. That is, since the structure is not complex, it is easy to make and further there is no rise in the production cost along with complication of the process.

Further, since there is one bit line, the cell area is small, and the degree of integration can be made higher and since a logic transistor can be used without any major change, the compatibility with the CMOS logic process is good and it is possible to mount a DRAM function together with a logic circuit by few processes.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

Figure 1:
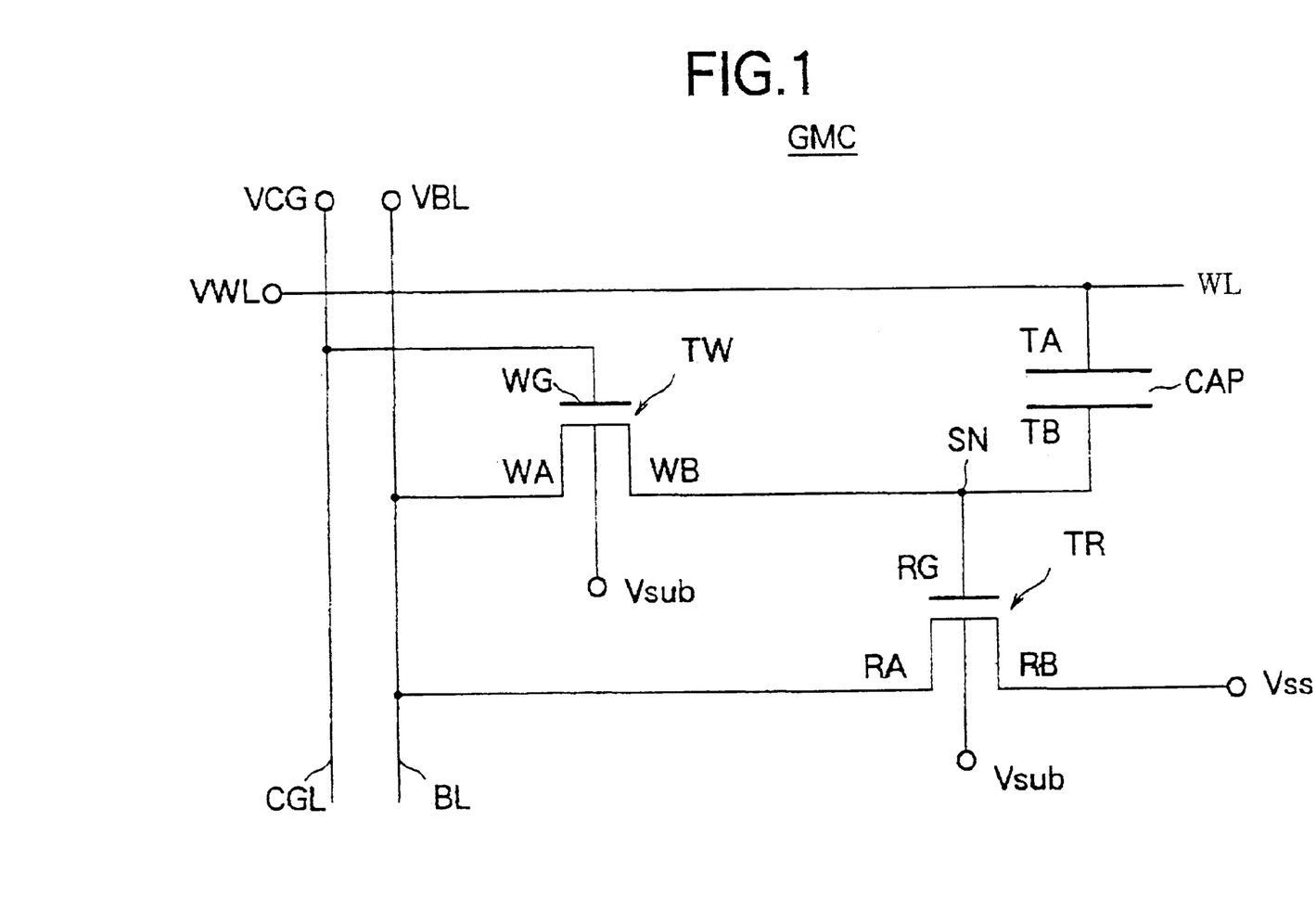
FIG. 1 is a circuit diagram of an embodiment of a gain cell as a semiconductor device according to the present invention.

FIG. 1 is a circuit diagram of an embodiment of a gain cell as a semiconductor device according to the present invention.

This gain cell GMC, as shown in FIG. 1, has a read transistor TR, write transistor TW, capacitor CAP, bit line BL, word line WL, and control gate line CGL.

Note that in FIG. 1, TA denotes a first electrode of the capacitor CAP, TB denotes a second electrode of the capacitor CAP, WG denotes a gate terminal of the write transistor TW, WA denotes one source/drain terminal of the write transistor TW, WB denotes the other source/drain terminal of the write transistor TW, RG denotes a gate terminal of a read transistor TR, RA denotes one source/drain terminal of the read transistor TR, and RB denotes the other source/drain terminal of the read transistor TR.

For example, m×n (m, n: any natural numbers) number of cells GMC are arranged in matrix in a memory cell array.

In the case of this array structure, the first electrodes TA of the capacitors CAP of memory cells arranged on the same row are connected to a common word line WL.

Also, the gate terminals WG of the write transistors TW of memory cells arranged on the same column are connected to a common control gate line CGL.

Further, one source/drain terminals RA of the read transistors TR of the memory cells arranged on the same row are connected to the bit line BL.

Moreover, the bit line BL is connected to, for example, a not shown latch-type sense amplifier to which a reference cell is connected.

In this way, the gain cells GMC are used for a memory cell array, a memory peripheral circuit is added, and the assembly is embedded with a logic circuit (not shown in FIG. 1) in an LSI chip.

The write transistor TW and read transistor TR comprise insulation gate type field effect transistors, for example, n-channel MOS (NMOS transistors).

In a write transistor TW, the gate terminal WG is connected to the control gate line CGL, one source/drain terminal WA is connected to the bit line BL, and the other source/drain terminal WB is connected to the second electrode TB of the capacitor CAP.

In a read transistor TR, the gate terminal RG is connected to the second electrode of the capacitor CAP, one source/drain terminal RA is connected to the bit line BL, and the other source/drain terminal RB is connected to a supply line of a reference voltage $V_{SS}$ (ground voltage GND).

A storage node SN of the memory cell GMC is comprised by the connection point of the second electrode TB of the capacitor CAP and the other source/drain terminal WB of the write transistor TW connected thereto and the gate terminal RG of the read transistor TR.

In the capacitor CAP, the first electrode TA is connected to the word line WL.

The capacitor CAP does not have to be large in capacity, so is configured by so-called MIM (metal insulator metal) type capacitor formed by an insulator (layer) between two metal interconnections.

For example, the first electrode TA is configured by the same metal interconnection as the word line WL of aluminum (Al) etc., while the second electrode is configured by the metal interconnection for the logic circuit.

The insulator is formed by a nitride film formed by, for example, plasma CVD (hereinafter referred to as a plasma nitride film).

Further consider a capacitor CAP having such a configuration.

The charge stored in the capacitor CAP is mainly lost by junction leakage. 1 fA is assumed as a typical leak value.

If the potential difference to be stored is 1V and the discharge time (data holding time) is 600 ms, the held charge becomes as follows:

$$600 \text{ ms} \times 1 \text{ fA} = 0.6 \text{ fC}$$

Further, the capacity of the capacitor CAP becomes as follows:

$$0.6 \text{ fC}/1\text{V} = 0.6 \text{ fF}$$

If $8F^2$ (F is a design rule) is assumed as an electrode area of the capacitor CAP, when F=0.13 $\mu$m, $8F^2$=0.1352 $\mu$m$^2$. If a dielectric of a dielectric constant=7 is used, the thickness d of the insulator becomes 14 nm as shown below.

$$d=(7 \cdot 8.854e\text{-}12 \cdot 0.1352e\text{-}12/(0.6e\text{-}15)=14e\text{-}9[\text{m}]$$

The above condition can be sufficiently realized if a plasma nitride film is used as an insulating film.

Also, the capacitor CAP is not a capacitor such as one of a complex general purpose DRAM and may be a parallel-plate type capacitor.

Further, a plasma nitride film is formed by a low temperature process enabling it to be used even after Al or other interconnections are formed, so it is possible to make an MIM type capacitor making use of an interconnection layer of a logic circuit as mentioned above.

Next, the pattern and example of the sectional structure of a memory cell GMC of a single bit line type of FIG. 1 will be explained with reference to FIGS. 2, 3A and 3B.

Figure 2:
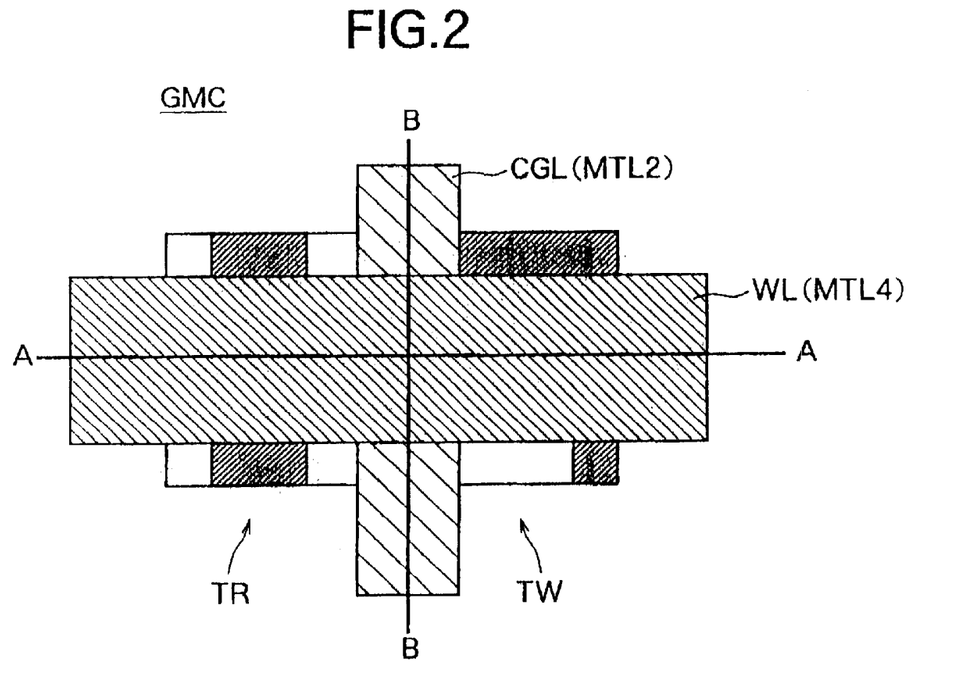
FIG. 2 is a pattern diagram of a memory cell according to the present embodiment.
Figure 3A:
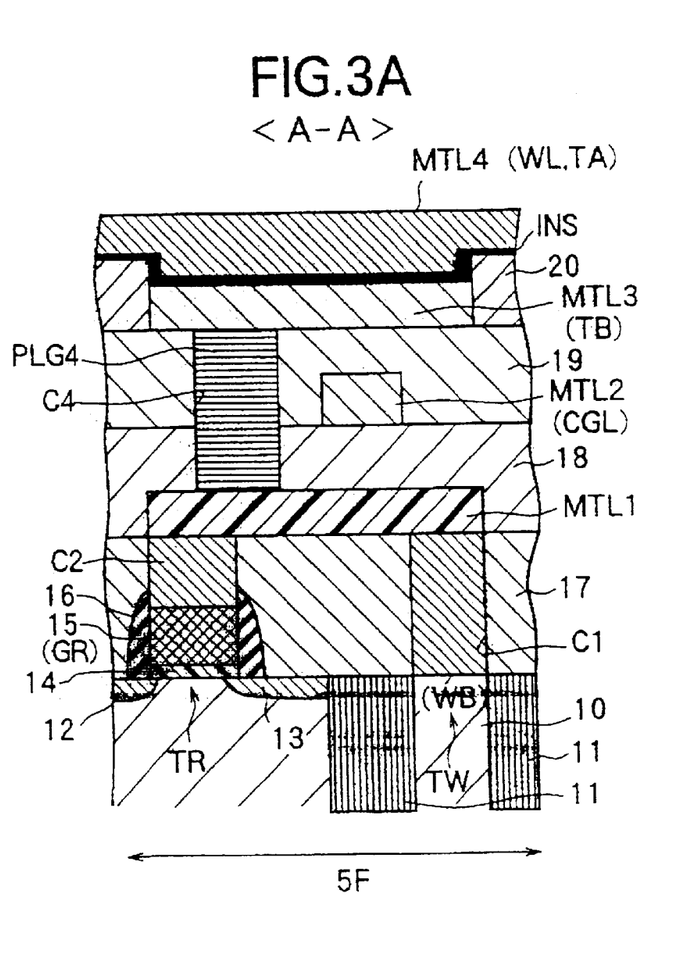
FIG. 3A is a sectional view along the line A—A in FIG. 2.
Figure 3B:
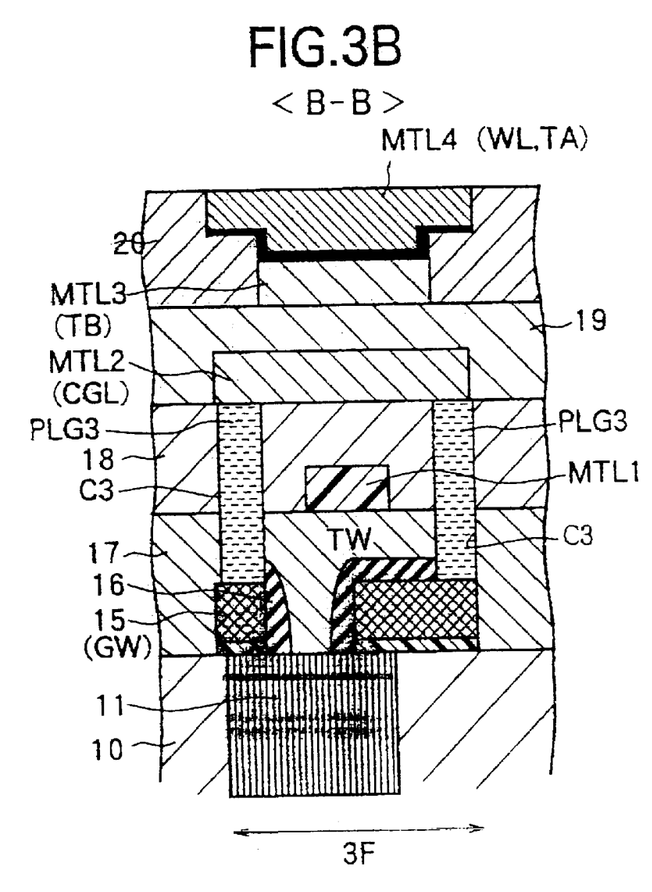
FIG. 3B is a sectional view along the line B—B in FIG. 2.

FIG. 2 is a pattern diagram of the memory cell GMC according to the present embodiment, FIG. 3A is a sectional view along the line A—A in FIG. 2, and FIG. 3B is a sectional view along the line B—B in FIG. 2. Note that although the control gate line CGL and bit line BL are arranged so as to be parallel in the present embodiment, they may also be arranged so that the control gate line CGL is parallel to the word line WL.

As shown in FIGS. 3A and 3B, the memory cell GMC according to the present embodiment has four, that is, first to fourth, metal interconnection layers MTL1 to MTL4 comprising, for example, Al.

The first metal interconnection layer MTL1 is a layer for connecting a drain of the write transistor TW to a gate of the read transistor TR.

The second metal interconnection layer MTL2 is a layer comprising the control gate line CGL.

The third metal interconnection layer MTL3 is a layer comprising the second electrode of the capacitor CAP (bottom electrode in a case of a stacked structure) TA.

The fourth metal interconnection layer MTL4 is a layer comprising the first electrode of the capacitor CAP (top electrode in the case of a stacked structure) TB serving also as a word line WL.

Also, the word line and control gate line CGL of the write transistor are independent.

Thus, there is no limit on the relationship between the capacitance of the capacitor CAP and threshold voltage of the write transistor TW.

In this memory cell GMC, as shown in FIGS. 3A and 3B, for example a shallow trench isolation (STI) 11 for element isolation is formed on a silicon or other semiconductor substrate 10, and the write transistor TW and read transistor TR are formed in an active area isolated by the STI 11.

The write transistor TW and read transistor TR are each comprised of a gate insulating film 14 formed on a channel formation region between the source/drain areas 12 and 13, a gate electrode 15 comprised of polycrystalline silicon formed on the gate insulating film 14, and a sidewall 16 formed by silicon nitride (SiN).

That is, the write transistor TW and read transistor TR have the same structure as a MOS transistor comprising the logic circuit of the peripheral circuit and are formed by a similar process as a normal MOS transistor as mentioned later.

The first metal interconnection layer MLT1 is formed on the first interlayer insulating film 17 formed so as to cover the write transistor TW and read transistor TR and with a flattened upper surface.

The first interlayer insulating film 17 is formed with a contact hole C1 extending from a bottom surface of the first metal interconnection layer MLT1 to the other source/drain terminal WB of the write transistor TW and a contact hole C2 extending to the gate electrode GR of the read transistor TR. These contact holes C1 and C2 are embedded with plugs PLG1 and PLG2 comprised of, for example, tungsten (W).

That is, the other source/drain terminal WB of the write transistor TW and the gate electrode GR of the read transistor TR are connected via the plug PLG1, the first metal interconnection layer MLT1, and the plug PLG2.

The second metal interconnection layer MLT2 serving as the control gate line CGL is formed on the second interlayer insulating film 18 formed so as to cover the first metal interconnection layer MLT1 and with a flattened top surface.

The second interlayer insulating film 18 and first interlayer insulating film 17 are formed with a contact hole C3 extending from a bottom surface of the second metal interconnection layer MLT2 to the gate electrode GW of the write transistor TW. The contact hole C3 is embedded with a plug PLG3 comprising W.

That is, the gate electrode GW of the write transistor TW is connected to the second metal interconnection layer MLT2 serving as the control gate line CGL via the plug PLG3.

The second electrode TA of the capacitor CAP is formed on a third interlayer insulating film 19 formed so as to cover the second metal interconnection layer MLT2 and with a flattened top surface.

The third interlayer insulating film 19 and second interlayer insulating film 18 are formed with a contact hole C4 extending from a bottom surface of the third metal interconnection layer MLT3 to the first metal interconnection layer MLT1. The contact hole C4 is embedded with a plug PLG4 comprising W.

That is, the other source/drain terminal WB of the write transistor TW and the gate electrode GR of the read transistor TR are connected to the first electrode TA of the capacitor CAP via the plug PLG4, the first metal interconnection layer MLT1, and the plugs PLG1 and PLG2.

Further, a fourth interlayer insulating film 20 with a top surface located higher than the top surface of the third metal interconnection layer MLT3 is formed on the circumference other than the top surface of the third metal interconnection layer MLT3.

The plasma nitride film INS serving as the insulator of the capacitor CAP is formed on the top surface of the third metal interconnection layer MLT3 and the top surface of the fourth interlayer insulating film 20. The fourth metal interconnection layer MLT4 is formed on the top surface of the plasma nitride film INS.

Next, the process of production of the unit memory cell GMC as shown in FIG. 2 and FIGS. 3A and 3B will be explained with reference to the drawings.

FIGS. 4A and 4B and FIGS. 5A and 5B are simplified sectional views for explaining the process of production, while FIGS. 6A to 6C, FIGS. 7A to 7C, and FIGS. 8A to 8C are plane views for explaining the process of production.

Note that FIGS. 4A and 4B and FIGS. 5A and 5B are sectional views along the line A—A of FIG. 2. Here, the diffusion layer etc. are omitted. Also, in the following explanation, the annealing, washing, etc. will be omitted.

(1) Formation of Element Isolation (STI)

Figure 4A:
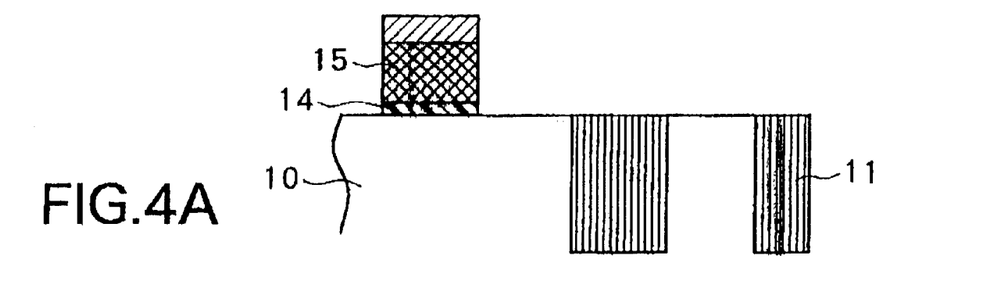
FIGS. 4A and 4B are sectional views for explaining the process of production of a memory cell according to the present invention.
Figure 6A:
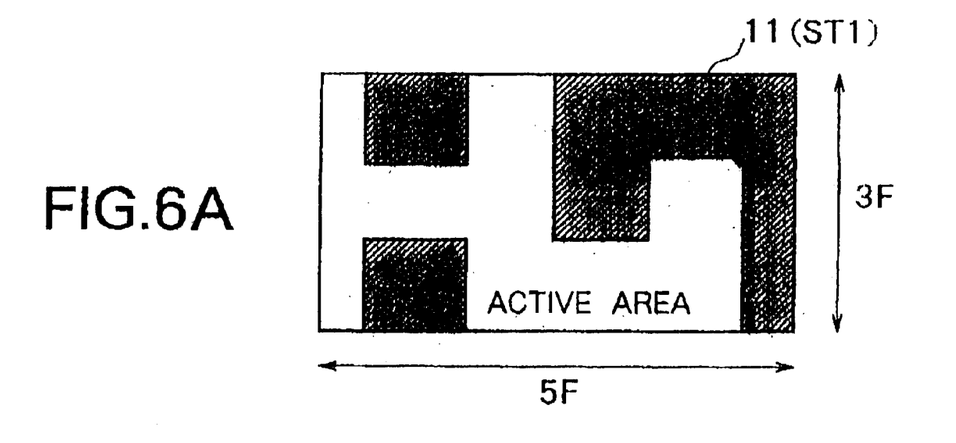
FIGS. 6A to 6C are plane views for explaining the process of production of a memory cell according to the present invention.

First, as shown in FIGS. 4A and 6A, the STI 11 is formed by forming a trench at a predetermined region of the semiconductor substrate 10, then burying the trench with an oxide insulating film, that is, by the normal method.

Further, the active region is formed with a p-well in the case of an NMOS and is formed with an n-well in the case of a p-channel MOS. Ions are implanted for adjusting the threshold voltage in accordance with need.

(2) Formation of Gate Electrode

Next, as shown in FIG. 4A, a gate oxide film 14 is formed on the active region of the semiconductor substrate 10.

Figure 6B:
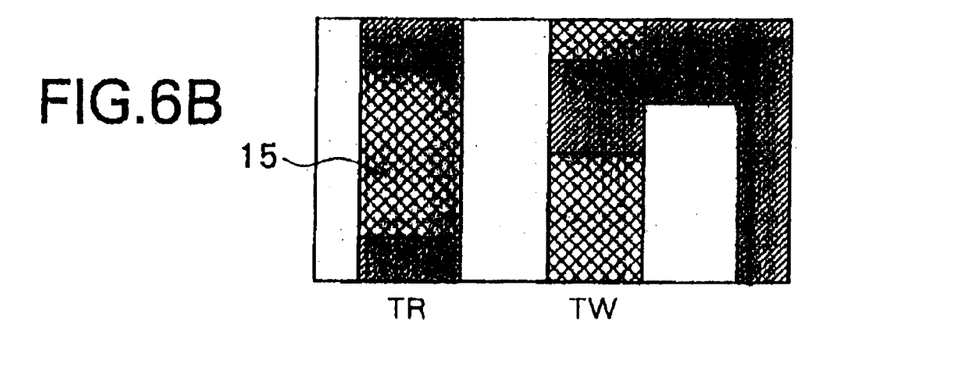

After the gate oxide film 14 is formed, as shown in FIGS. 4A and 6B, a gate electrode 15 is formed by CVD etc. using polycrystalline silicon as the gate electrode material. This is then doped by means such as ion implantation to reduce the resistance.

Note that it is also possible to use doped polycrystalline silicon at that time and possible to use a so-called polymetal structure of a stacked structure of W, WN, and polycrystalline silicon from the top.

To form the electrodes, first the SiN is processed using the photoresist (PR) as a mask, then etching is performed using the SiN as a mask.

(3) Formation of Contacts 1

Figure 4B:
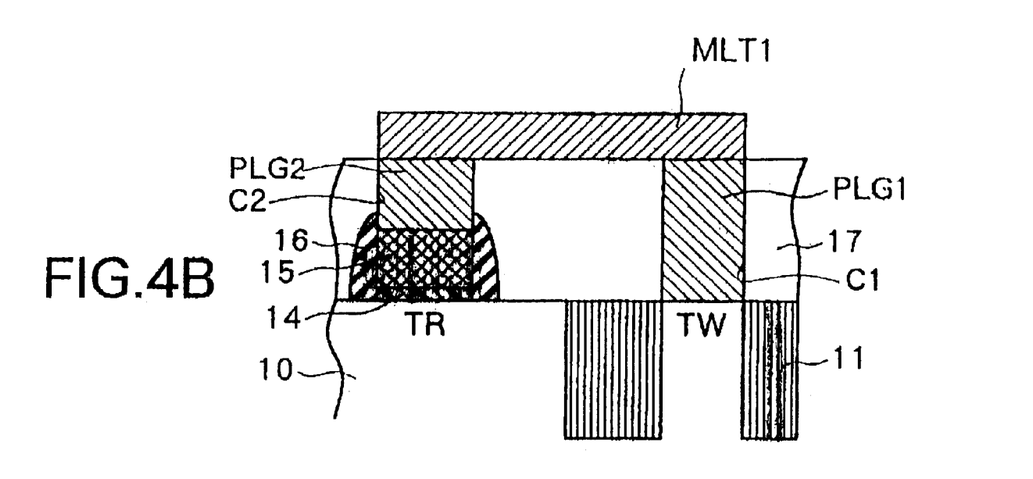

After LDD ion implantation, as shown in FIG. 4B, a SiN film is formed by CVD and a sidewall 16 is formed by etchback.

Figure 6C:
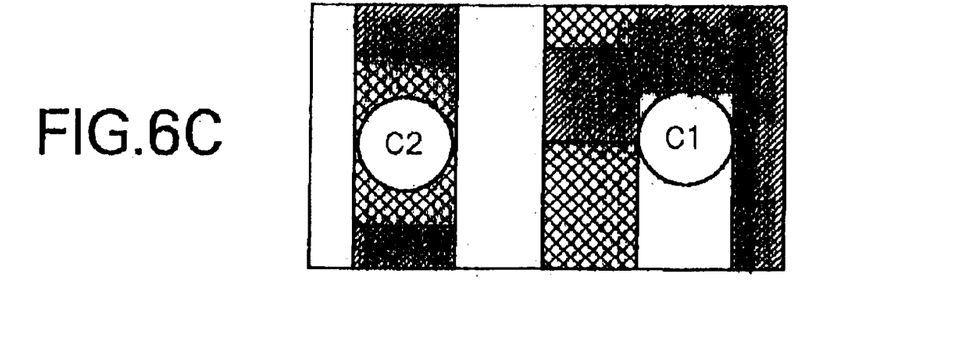

Next, the first interlayer insulating film 17 is formed and preferably flattened, then, as shown in FIGS. 4B and FIG. 6C, first, the contact hole C1 is formed down to the semiconductor substrate 11 and, next, the contact hole C2 is formed down to the gate electrode 15 for the read transistor TR.

Note that normally to lower the resistance before forming the contacts, the source/drain of the logic portion is silicided, but the DRAM portion of this explanation is covered with the interlayer insulating film and made not to be silicided (prevents an increase in the junction leakage by siliciding).

(4) Connection of Gate of TR and Source/Drain of TW

Figure 7A:
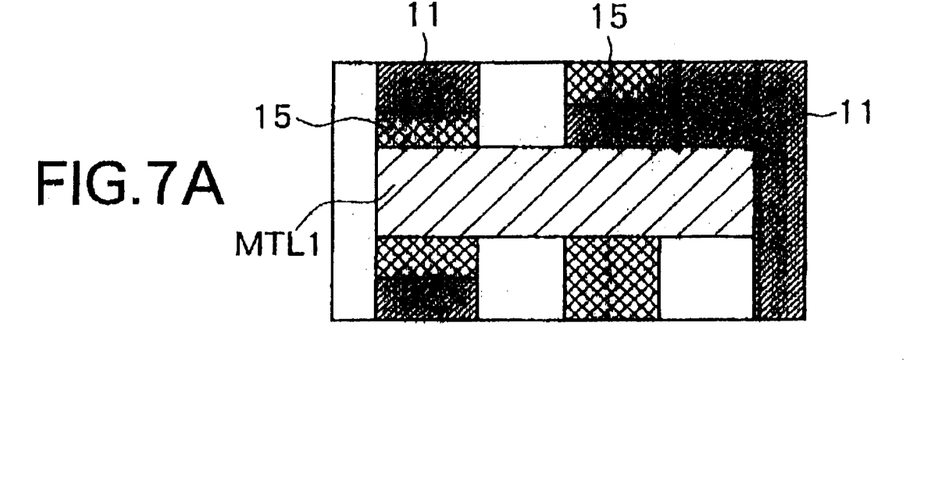
FIGS. 7A to 7C are plane views for explaining the process of production of a memory cell according to the present invention.

Next, as shown in FIG. 4B and FIG. 7A, W etc. is used to form plugs PLG1 and PLG2 in the contact holes C1 and C2, then the first metal interconnection layer MTL1 is formed on the first interlayer insulating film 17 to connect the source/drain of the write transistor TW and the gate electrode 15 of the read transistor TR.

(5) Formation of Contacts 2

Figure 7B:
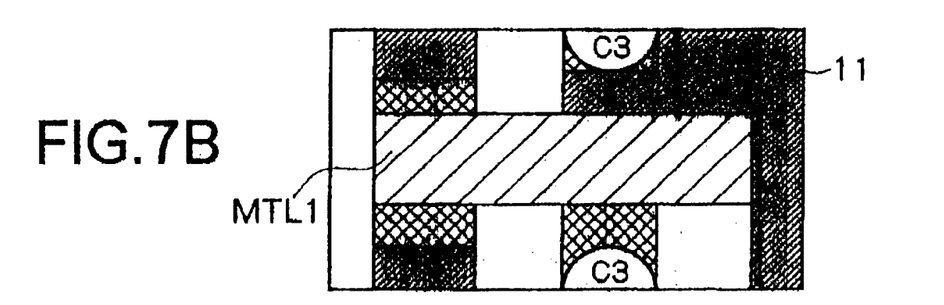

As shown in FIG. 5C, the second interlayer insulating film 18 is formed and preferably flattened, then, as shown in FIG. 7B, the contact hole C3 is formed for the gate electrode for the write transistor TW.

Next, the plug PLG3 is formed by W etc.

(6) Formation of CG Interconnection

Figure 7C:
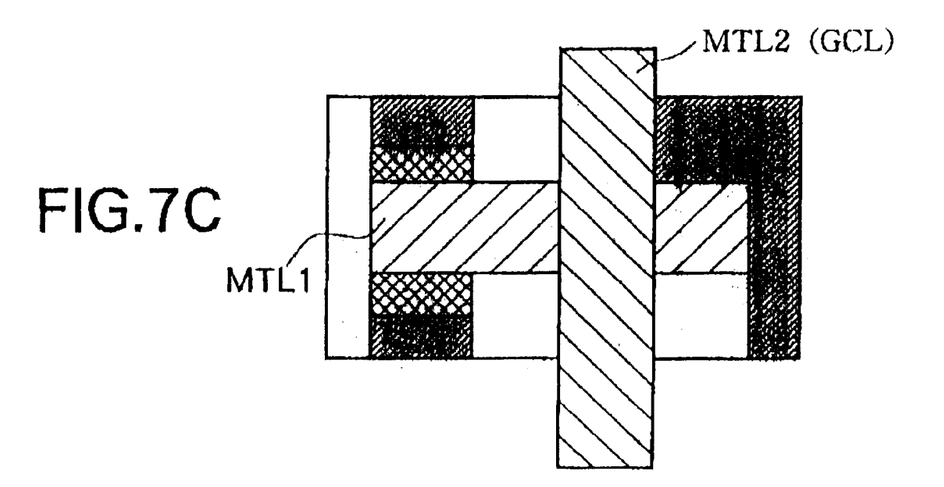

Further, as shown in FIG. 5C and FIG. 7C, the second metal interconnection layer MLT2 serving as the control gate line CGL connecting the plugs PLG3 (contact holes C3) is formed on the second interlayer insulating film 18.

(7) Formation of Contact for Capacitor Bottom Electrode

Figure 5A:
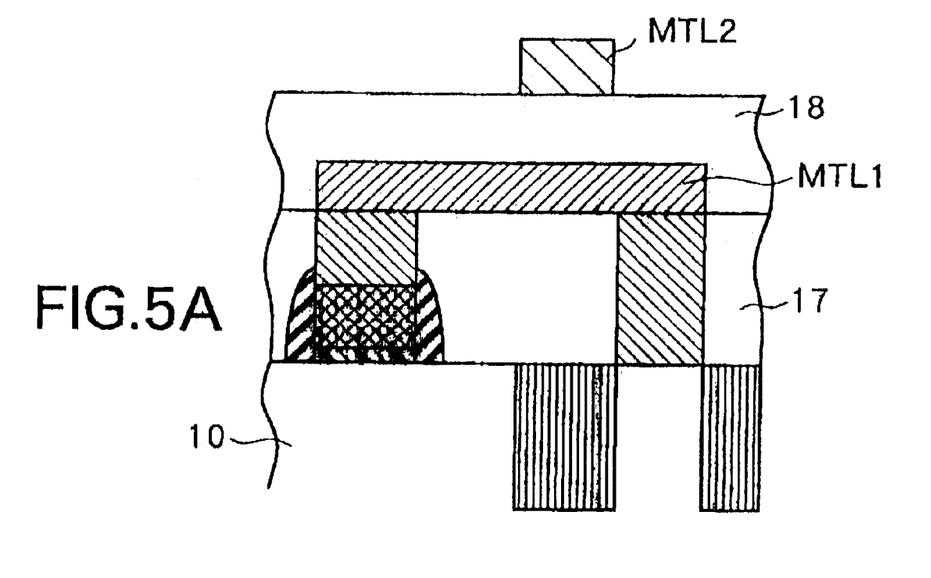
FIGS. 5A and 5B are sectional views for explaining the process of production of a memory cell according to the present Invention.
Figure 8A:
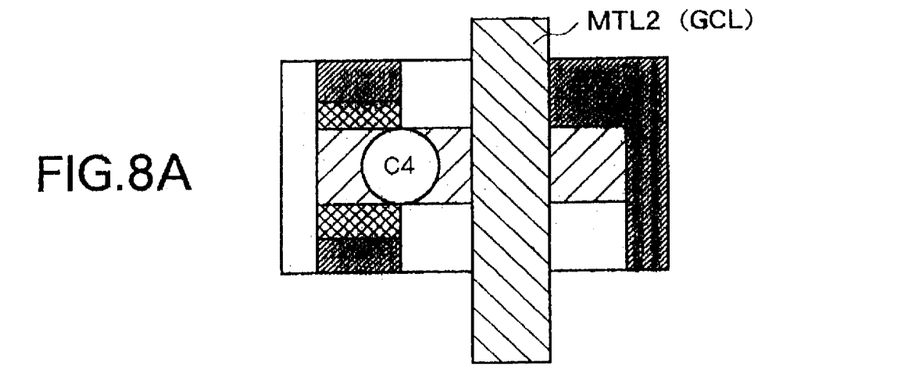
FIGS. 8A to 8C are plane views for explain the process of production of a memory cell according to the present invention.

As shown in FIG. 5A, the third interlayer insulating film 19 is formed and preferably flattened, then, as shown in FIG. 8A, a contact hole 4 for a capacitor bottom electrode reaching the metal interconnection layer MTL1 is formed on the third interlayer insulating 19 and the second interlayer insulating film 18.

(8) Formation of Capacitor Bottom Electrode

Figure 5B:
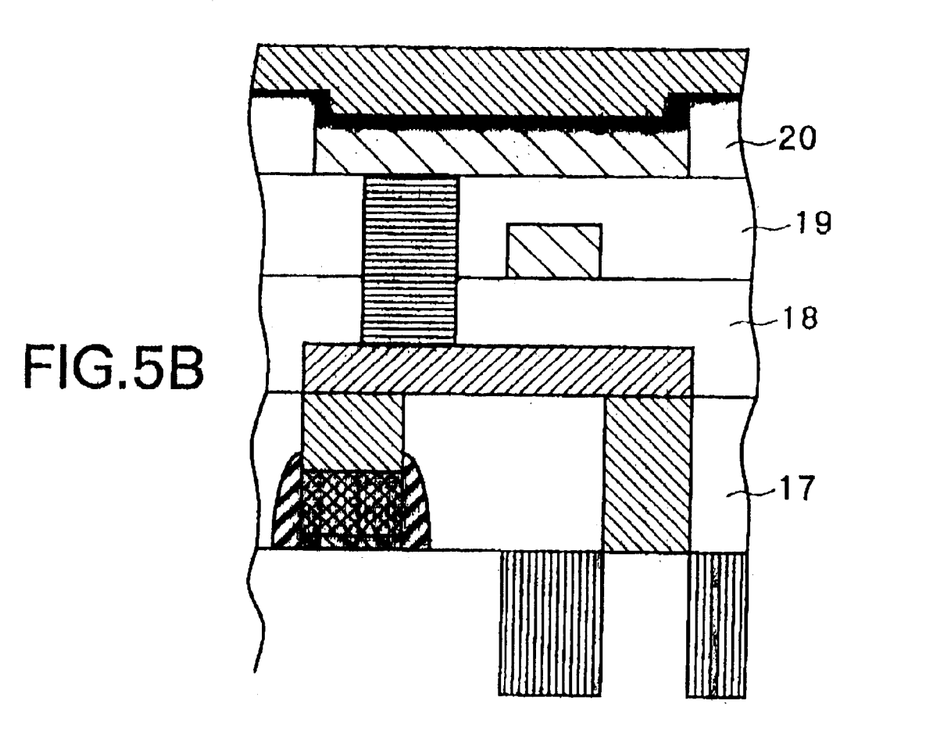

As shown in FIG. 5B, a plug PLG4 comprising W is formed in the contact hole C4.

Figure 8B:
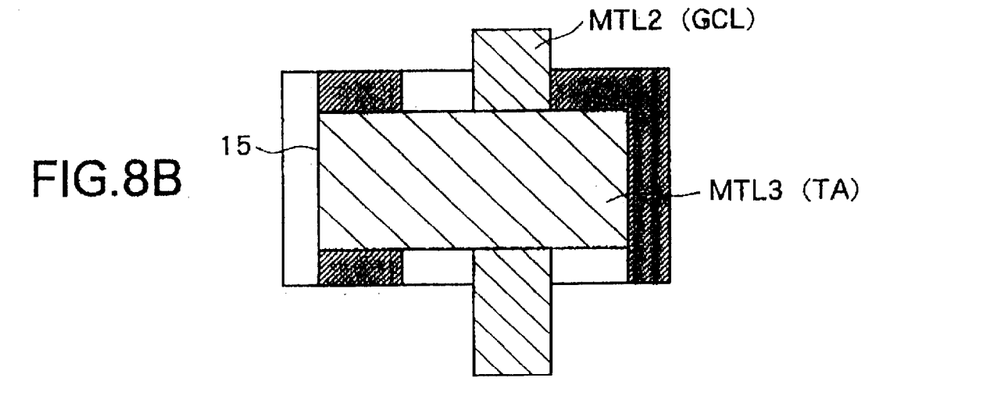

Further, as shown in FIG. 5B and FIG. 8B, a second electrode TA (bottom electrode) of the capacitor CAP is formed.

(9) Formation of WL

As shown in FIG. 5B, a fourth interlayer insulating film 20 is formed and preferably flattened, then a window is formed in the capacitor bottom electrode and a capacitor insulating film INS of plasma SiN etc. is formed.

Figure 8C:
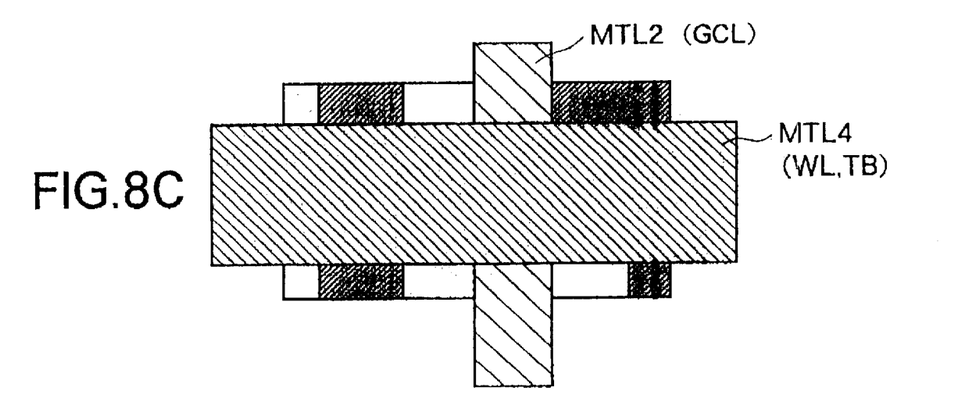

Further, as shown in FIG. 5B and FIG. 8C, a fourth metal interconnection layer MLT4 serving as the first electrode of the capacitor CAP (top electrode) and the word line WL is formed.

Note that when producing the peripheral circuit in parallel by this process, the increase in the number of masks is only one.

Further, when the plasma nitride film is not necessary other than at the DRAM cell portion, the unnecessary portions can be removed by further adding one mask.

This completes production of a unit cell.

Figure 9:
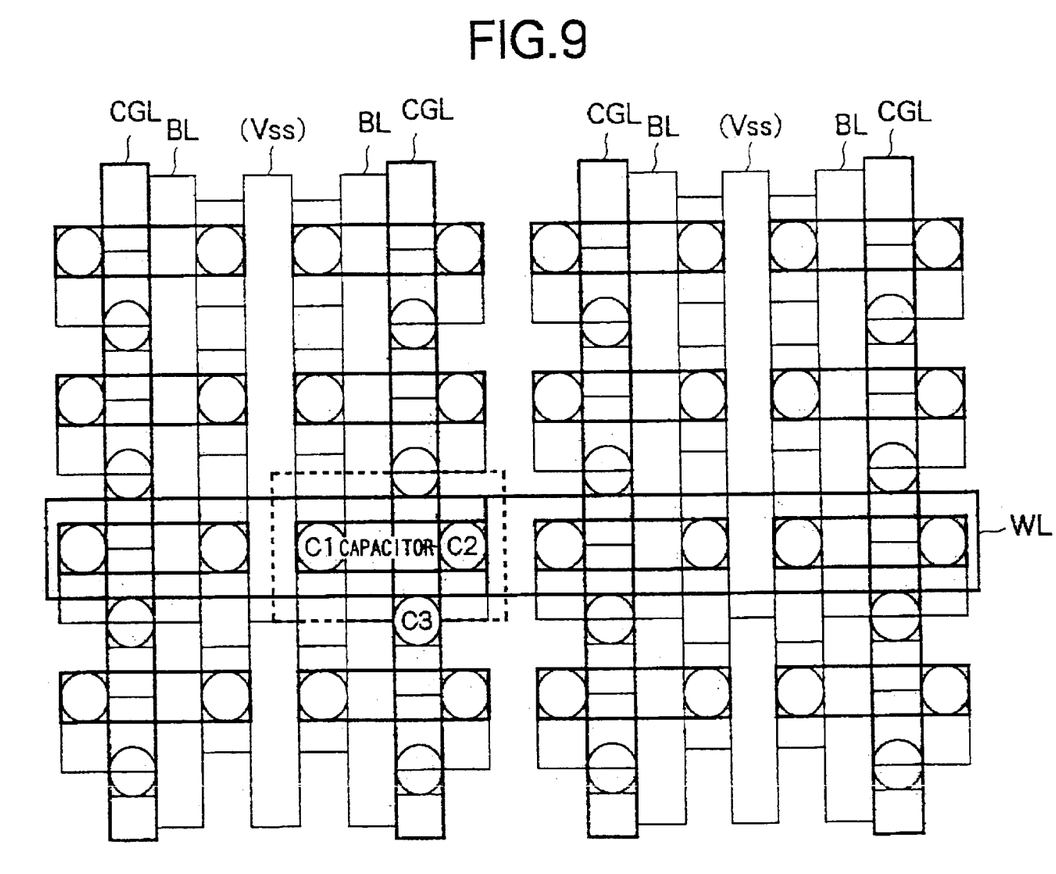
FIG. 9 is a view of an example of the layout of the DRAM gain cell according to the present invention.

FIG. 9 is a view of an example of the layout when arranging memory cells GMC produced as mentioned above in a matrix.

In this layout, as shown in FIG. 9, the fourth metal interconnection layer MTL4 serving as the word line WL and the first metal line layer MTL1 connecting the contact holes C1 and C2 are formed so as to be parallel. The second metal interconnection layer MLT2 serving as the control gate line CGL connecting the contact holes C3 is formed in an orthogonal direction to these.

In the case of this layout, if considering cell area by using the design rule F, the cell area becomes $15F^2$ and the capacitor area becomes $8F^2$.

In a case other than the layout of FIG. 9, the cell area could become $16F^2$ or more.

Therefore, the cell area can be reduced by this layout and, consequently, a cost reduction can be achieved.

Next, the write, erase, and read operations of the memory cell GMC of the above configuration will be explained.

Write Operation

First, the word line WL to which the selected cell is connected is set to the ground potential, the bit line BL is set to a high potential (high level H; power supply voltage level), and the control gate line CGL is set to a high potential (high level H; power supply voltage level).

Due to this, the write transistor TW becomes a conductive state and the charge of the bit line BL is stored in the capacitor CAP.

In this case, in the capacitor CAP, the second electrode TB becomes high in potential with respect to the first electrode TA.

Further, the threshold VthR of the read transistor TR is effectively reduced by the charge stored in the capacitor CAP.

Erase Operation

First, the word line WL to which the selected cell is connected is set to the ground potential, the bit line BL is set to the ground potential, and the control gate line CGL is set to the high potential (high level H; power supply voltage level).

Due to this, the write transistor TW becomes the conductive state, and the charge stored in the capacitor CAP is discharged to the bit line BL.

In this case, in the capacitor CAP, the first electrode TA and the second electrode TB become the same potential.

As a result, the threshold VthR of the read transistor TR is held at the initial value.

Read Operation

First, the control gate line CGL to which the selected cell is connected is set to the ground potential, the word line WL is set to a ground potential, and the bit line BL is set to the high potential (high level H; power supply voltage level), then electrically floats.

Due to this, the write transistor TW is held in the non-conductive state. If the capacitor CAP stores a change sufficient to turn on the read transistor TR at this time, the read transistor TR becomes the conductive state, the charge of the bit line flows to the supply line of a reference voltage $V_{ss}$, and the potential of the bit line falls.

On the other hand, if the capacitor CAP does not store a change sufficient to turn on the read transistor TR, the read transistor TR is held in the non-conductive state. Therefore, the bit line potential does not fall.

Further, the difference of the written data is differentiated by which of the above states occurs in the bit line potential in a predetermined time.

According to the present embodiment, since provision is made of a bit line BL, word line WL, control gate line CGL, capacitor CAP with a first electrode TA connected to the word line WL, a read transistor TR comprising an NMOS connected between the bit line BL and a predetermined potential point and with a gate electrode connected to the second electrode TB of the capacitor CAP, and a write transistor TW comprising an NMOS connected between the bit line BL and the second electrode TB of the capacitor CAP and with a gate electrode connected to the control gate line CGL, the capacitance of the capacitor does not determine the size (amplitude) of the read data of the bit line like with a one-transistor one-capacitor type DRAM and a comparatively small capacitance value is enough.

Further, with the DRAM gain cell according to the present embodiment, even if the capacitance value of the capacitor is small, the cell operation is stable, there is resistance to noise, and there is little erroneous operation.

A capacitor with a large capacitance is not necessary and there is no need for a complicated electrode structure for raising the amount of stored charge per unit area of the capacitor or new development of a material for the electrodes or dielectric film.

Further, in the semiconductor device according to the present embodiment, there is one bit line BL in the memory cell, and the write transistor TW and read transistor TR are both connected to the bit line BL. Therefore, the cell area can be reduced and the degree of integration can be raised.

Further, since a bulk type transistor is used, the compatibility with the CMOS logic process is good and it becomes possible to add a DRAM function to a logic IC chip with few processes.

Due to this, the production process can be simplified, the cost can be reduced, and a memory-logic hybrid IC with a high reliability of operation can be realized by the present invention.

Summarizing the effect of the invention as explained above, the semiconductor device according to the present invention, the cell area can be reduced without an effect on accuracy and the number of interconnection layers can be reduced.

Further, in the case of the bulk type, there are the advantages that the compatibility with the CMOS logic process is good and it is possible to add a DRAM function to the logic IC chip with little processes.

Due to the above, the cost can be reduced without adding a complex production process and a hybrid circuit of a memory-peripheral circuit (logic circuit) can be realized.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor device comprising:

a memory cell having a plurality of active elements and at least one passive element, wherein:

the plurality of active elements comprising the memory cell comprises field effect transistors having three terminals which comprise two diffusion layers forming a source or drain and a gate, or four terminals which comprise two diffusion layers forming a source or drain, a gate, and a substrate or a layer which includes an area at which channel is formed, the passive element comprising the memory cell comprises a capacitor having an insulating layer between a first electrode and a second electrode, the active elements comprising the memory cell include at least a transistor having a function of writing data and a transistor having a function of reading data, the memory cell comprises two field effect transistors and one capacitor, a first field effect transistor comprises an N-channel type or P-channel type, and a second field effect transistor comprises an N-channel type or P-channel type, and the memory cell is configured by a second diffusion layer terminal of the first field effect transistor, the second electrode of the capacitor, and a gate electrode terminal of the second field effect transistor connected together and, further, the first electrode of the capacitor is connected to a word line, a first diffusion layer terminal of the first field effect transistor is connected to a bit line, a gate terminal of the first field effect transistor is connected to a control gate line, a first diffusion layer terminal of the second field effect transistor is connected to the bit line, and a second diffusion layer terminal of the second field effect transistor is connected to a predetermined power supply terminal.

2. A semiconductor device as set forth in claim 1, wherein at least one of the first electrode and second electrode of the capacitor serves also as an interconnection layer.

3. A semiconductor device as set forth in claim 2, wherein the memory cell is embedded with a logic circuit.

4. A semiconductor device as set forth in claim 1, wherein all of the active elements comprising the memory cell comprise N-type field effect transistors or P-type field effect transistors.

5. A semiconductor device as set forth in claim 4, wherein the memory cell is embedded with a logic circuit.

6. A semiconductor device as set forth in claim 1, wherein when arranging the memory cell in an array, the gate electrode terminal of the first field effect transistor of each of a plurality of memory cell connected to one word line is connected to one control gate line.

7. A semiconductor device as set forth in claim 6, wherein the memory cell is embedded with a logic circuit.

8. A semiconductor device as set forth in claim 1, wherein when arranging the memory cell in an array, the gate electrode terminal of the first field effect transistor of each of the plurality of memory cells connected to one bit line is connected to one control gate line.

9. A semiconductor device as set forth in claim 8, wherein the memory cell is embedded a logic circuit.

10. A semiconductor device as set forth in claim 1, wherein the memory cell is embedded with a logic circuit.

* * * * *